United States Patent
Gaynes et al.

(10) Patent No.: US 6,661,661 B2
(45) Date of Patent: Dec. 9, 2003

(54) COMMON HEATSINK FOR MULTIPLE CHIPS AND MODULES

(75) Inventors: Michael A. Gaynes, Vestal, NY (US); Howard Victor Mahaney, Jr., Cedar Park, TX (US); Mark V. Pierson, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/040,779

(22) Filed: Jan. 7, 2002

(65) Prior Publication Data

US 2003/0128518 A1 Jul. 10, 2003

(51) Int. Cl.[7] .................................................. H05K 7/20
(52) U.S. Cl. .................... 361/705; 29/890.03; 361/719; 257/713; 438/106
(58) Field of Search .............................. 257/706, 707, 257/712, 713, 719, 722, 723; 438/106, 122; 29/890.03, 721, 726, 740, 832; 165/80.3, 185; 174/16.3; 361/703–705, 709–712, 715, 717–719, 752, 758

(56) References Cited

U.S. PATENT DOCUMENTS

| | | | | |
|---|---|---|---|---|
| 5,022,462 A | * | 6/1991 | Flint et al. .................. 165/80.4 |
| 5,168,348 A | * | 12/1992 | Chu et al. .................... 257/713 |
| 5,653,280 A | * | 8/1997 | Porter ........................ 165/80.3 |
| 5,956,576 A | * | 9/1999 | Toy et al. .................... 438/125 |
| 6,373,133 B1 | * | 4/2002 | DiGiacomo et al. ........ 257/713 |
| 6,385,047 B1 | * | 5/2002 | McCullough et al. ....... 361/704 |

* cited by examiner

*Primary Examiner*—Gerald Tolin
(74) *Attorney, Agent, or Firm*—Scully, Scott, Murphy & Presser

(57) ABSTRACT

A common heatsink for multiple chips and modules which are spaced on electronic packages, and an arrangement for the formation of precision gaps intermediate two or more chips or modules covered by a common heatsink. Furthermore, a precision tool enables positioning of a common heatsink for multiple chips and modules for electronic packages facilitating the formation of x, y and z-directional compliant thermal interfaces intermediate a plurality of chips and a common heatsink with minimized effects of package tolerances.

7 Claims, 2 Drawing Sheets

COMMON HEATSINK FOR MULTIPLE CHIPS AND MODULES

BACKGROUND OF THE INVENTION

1. Field of the Invention

The present invention relates to the provision of a common heatsink for multiple chips and modules which are spaced apart on electronic packages, and to an arrangement for the formation of precision gaps between two or more chips or modules covered by a common heatsink. Furthermore, the invention is directed to the provision of a method for the production of a common heatsink for multiple chips and modules for electronic packages facilitating the formation of compliant thermal interfaces between a plurality of chips and a common heatsink with minimized effects of package tolerances.

In the electronic package technology, it is of extreme importance to be able to provide heatsinks, such as in the nature of plate-shaped caps or cover structures which are positioned over the semiconductor chips or other modules or leaded components of electronic packages, in order to maximize the dissipation of heat which is generated during operation, and reduce the deleterious effects thereof on reliability and functioning of the package.

Frequently, in the current state of the electronic packaging manufacturing technology, the manufacture, handling, and costs and aesthetic aspects are directed to the positioning of a single heatsink over a plurality of heat sources, such as the semiconductor chips and modules of the electronic packages. Potential variations in module heights and the elevations of the various chips which may differ relative to each other when mounted on the package substrates, necessitates the need for extremely thin thermal interfaces, and wherein there are encountered thermal expansion mismatches, which upon occasion renders impossible the ability of attaining the use of a single rigid heatsink for a plurality of chips and modules. Accordingly, it is an important aspect of the electronic package manufacturing technology to be able to provide common heatsinks for pluralities of chips and modules which will take cognizance of mismatches in height caused by the encountered thermal interfaces and thermal expansions.

Although the prior art to some extent concerns itself with the use of various types of heatsinks in connection with the dissipation of heat from semiconductor chips or modules of electronic packages, and has even directed itself to providing heatsinks for pluralities of chips and modules, these are not always satisfactory due to the relatively rigid nature of the common heatsink which fails to take adequate cognizance of the physical mismatches and thermal expansion problems encountered by the discrete components of the electronic packages.

2. Discussion of the Prior Art

Sammakia et al. U.S. Pat. No. 6,058,015, which is commonly assigned to the assignee of the present application, discloses an electronic package wherein a stiffener ledge is equipped with a thermally conductive material which attaches a heatsink cover or lid portion to an adhesive on the stiffener ledge. This construction pertains to a heatsink for a single chip and is not adapted to provide for a common and compliant heatsink structure for multiple chips in a manner analogous to that of the present invention.

Dodge et al. U.S. Pat. No. 6,025,992, which is also assigned to the present assignee, discloses an integrated heat exchanger for a memory module in which a two-sided card is equipped with modules, and wherein a heatsink wraps around the opposite card surfaces. This does not provide for a type of heatsink structure which is common to a plurality of modules or semiconductor chips analogous to the present.

DiGiacomo et al. U.S. Pat. No. 5,981,310, which is assigned to the present assignee, although disclosing common heatsink structures for a module having a plurality of semiconductor chips, although disclosing a plurality of essentially compliant heatsinks, fails to provide a type of construction as disclosed by the present invention. This publication utilizes a heatsink which is constituted of a similar CTE (coefficient of thermal expansion) material as the substrate mounting the chips. Any heatsink compliance is only in a z-direction and does not enable compliance in other directions, such as in the x and y directions of a modular construction.

Sherif et al. U.S. Pat. No. 5,724,729 and U.S. Pat. No. 5,623,394, which are commonly assigned to the present assignee, each disclose an apparatus and method for cooling chips wherein different types of materials are interposed between a common heatsink and a plurality of discrete semiconductor chips over the extent of the various chip surfaces. These different thermally conductive adhesives facilitate a customized cooling of different types of chips, and do not provide for a common multi-directionally compliant heatsink structure for a plurality of semiconductor chips analogous to the inventive concept.

Alfaro et al. U.S. Pat. No. 5,650,915 discloses a thermally enhanced molded cavity package in which a single chip is provided with a heatsink. There is no disclosure of a compliant common heatsink structure for a multiple chips and modules analogous to that of the present invention.

Baker U.S. Pat. No. 5,003,429, which is assigned to the present assignee, discloses a solid common heatsink structure for a plurality of semiconductor chips in which any flexing or resilient deflection is only permitted at the leads of a modular construction. There is no disclosure of a compliant common heatsink structure for a plurality of chips and modules of an electronic package analogous to that of the present invention.

Romano' U.S. Pat. No. 4,887,149 discloses a single chip heatsink construction having screw clamping attachments at the edge thereof so as to enable the positioning of the heatsink relative to the semiconductor chip. There is no disclosure of utilizing a common heatsink for multiple chips and modules in a compliant arrangement analogous to that of the present invention.

Finally, Butt et al. U.S. Pat. No. 4,849,857 discloses a heat dissipating interconnecting structure for a single chip heatsink device which in no manner can be utilized for a common heatsink incorporating the compliant features in a manner analogous to the present invention, in conjunction with a plurality of chips and modules for an electronic package.

In essence, none of the prior art publications currently utilized in the technology provide for a common heatsink for multiple chips and modules of an electronic package incorporating a compliant thermal interface and a minimizing of the effect caused by package tolerances.

SUMMARY OF THE INVENTION

In particular, pursuant to preferred embodiments of the invention, a common heatsink for a plurality of semiconductor chips or leaded components positioned on a substrate, such as a printed or wiring circuit card or the like, includes a common heatsink incorporating compliant structure intermediate the various or adjacent chips so as to enable essentially universal compliance between the various chips and the covering heatsink portion in x, y and z directions.

In that regard, pursuant to various embodiments, intermediate a plurality of semiconductor the chips or modules which are positioned on a single substrate of an electronic package, a common heatsink for all of the chips or modules may be either severed or provided with regions of reduced thicknesses so as to enable the heatsink to be imparted compliant characteristics which will facilitate compliance in z, x and y directions between each respective chip or module, thereby producing compliant interfaces while concurrently minimizing or eliminating the effects of package tolerances.

Pursuant to another aspect of the invention, there is provided a precision tool which may be employed to set the height between the top surfaces of adjacent chips and a flat-machined bottom cover ledge so as to enable to forming of precision adhesive gaps for removing heat effectively in the provision of a plurality of chips and a common heatsink. Accordingly, it is an object of the present invention to provide an arrangement comprising a common heatsink for multiple chips and modules of an electronic package.

Another object of the present invention resides in the provision of a common heatsink for multiple semiconductor chips and modules of a electronic package wherein the common heatsink includes a compliant configuration and thermal interface so as to minimize the effects of package tolerances.

Yet another object of the present invention is to imparting a method of providing compliant thermal interfaces to a common heatsink for an electronic package mounting multiple semiconductor chips and modules so as to compensate for manufacturing tolerances and thermal interfacing effects.

A further object of the present invention resides in the provision of a tool which will enable the formation of precision adhesive gaps between a plurality chips so as to remove heat effectively through the intermediary of a compliant common heatsink.

A still further object is to provide a method of utilizing a tool for forming precision gaps of an adhesive nature intermediate small semiconductor chips in a common heatsink so as to set the height between the top surface of the chips and a bottom cover ledge of the heatsink.

An additional object of the invention may be ascertained in that there is derived a decoupling of the common heatsink from the semiconductor chips and module components in the x- and y-directions so as to reduce any thermal coefficients stresses which may be generated in the electric package.

BRIEF DESCRIPTION OF THE DRAWINGS

Reference may now be made to the following detailed description of preferred embodiments of the invention, taken in conjunction with the accompanying drawings; in which.

DETAILED DESCRIPTION OF PREFERRED EMBODIMENTS

Figure 1:
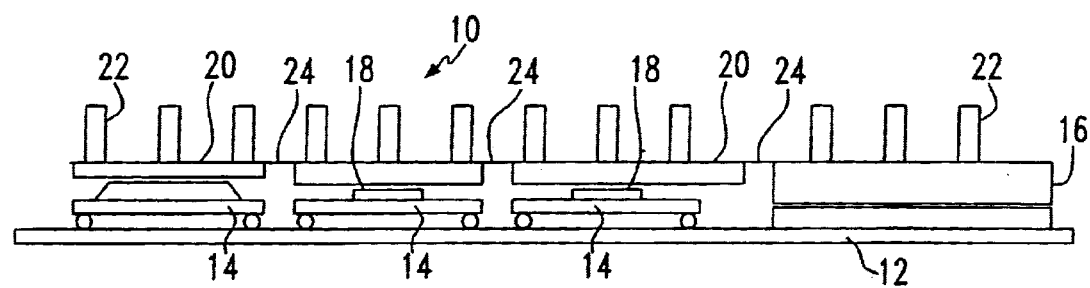
FIG. 1 illustrates, in a generally diagrammatic cross-section, an electronic package possessing a plurality of BGA modules and leaded components on a printed circuit card or substrate adapted to have a compliant common heatsink for the various components positioned to extend thereover.

Referring now in more specific detail to the drawings as illustrated in generally cross-sectional diagrammatic representations, shown in FIG. 1 is an electronic package 10 comprising a printed circuit card 12 which has a plurality of mutually spaced BGA modules 14 mounted thereon, and leaded components 16 soldered thereto. In view of the increasing levels of power dissipation and power density on the more recently designed types of semiconductor chips 18 of the modules which are being developed in the technology, this necessitates the provision of an extremely thin adhesive bond line, preferably of a thickness of about 0.001 to 0.003 inches between the chips 18 and a heatsink 20 positioned thereon. A failure to meet the foregoing requirements can cause the operating temperatures of the chip to rise to untenable levels and, resultingly adversely affect the function as well as the reliability of the entire electronic package 10. Normal manufacturing methods which are employed in the technology frequently result in module-to-module and card-to-card variations in the overall height of the components which are mounted thereon, in effect, the modules 14 and leaded components 16, rendering the attainment of a uniformly thin bond line between a common rigid heatsink 20, which may also incorporate upstanding heat-dissipating fins 22, for the various modules or chips to be impossible.

In order to overcome this variation in component height, the common heatsink 20 for the multiple modules 14 or 18 chips and the lead-connected components 16 which extends thereover, provides for regions 24 intermediate the modules 14 and components 16 which enable the common heatsink 20 to mechanically decouple in a z-direction (i.e. vertically) whereby each module 14 or chip 18 can minimize the bond line thickness so as to facilitate a good degree of heat transfer from the electronic components 14, 16, 18 to the heatsink 20. Thus, by way of example, for ceramic chip carrier packages, a low modulus adhesive, such as a silicone based composition, for instance GE 3281 (E=1500 psi), may be employed to transfer the heat from the chip 18 or module 14 to the heatsink 20 while providing flexibility in mounting on the card or substrate 12 when thermally cycled. In the instance of PBGAs (plastic ball grid arrays), it is necessary to provide an even lower modulus adhesive material in order to preserve the inherently excellent BGA fatigue life in comparison to ceramic BGAs. For example a composition such as Thermoset MG120 has a Young's modulus of 50 psi and a thermal conductivity of greater than 2.0 W/mk. This material can be readily employed over higher wattage chips, whereas the previously mentioned GE 3281 can be utilized for heatsinks over lower wattage chips.

Moreover, in addition to achieving and maintaining a control over a thin thermal interface on varying lots of modules and PNs, the z-axis compliant heatsink 20 also provides for the economic benefit of having to manufacture to order, stock and install only a single heatsink, as well as providing the benefits of improved aesthetics and the potential for a decrease in any contamination of the electronics of the package.

In addition to the foregoing, problems are encountered in view of potentially significant differences in the rates of thermal expansion between the heatsink 20 and the card 12, including those of the components 14, 16 and 18 mounted thereon, in consequence of the use of a single or common heatsink. Thus, in the case of plastic BGA (PBGA) components, the attachment of an aluminum heatsink possessing a CTE of 23.4 ppm/° C. to a single chip module with a composite CTE of less than 17 ppm/° C., can result in a degraded BGA fatigue life. Furthermore, a larger common heatsink positioned to extend over two or more modules 14 or chips 18 is likely to exert an even greater adverse effect on BGA fatigue life.

Consequently, in order to overcome the heatsink to module CTE mismatch over a larger heat spreader, as is common with regard to multiple modules, the undercut connection formed in a common heatsink in the regions between adjacent chips 18 or modules 14, 16 is altered to not only provide for z-directional compliance, but also to provide compliance in the x and y-directions.

Figure 2:
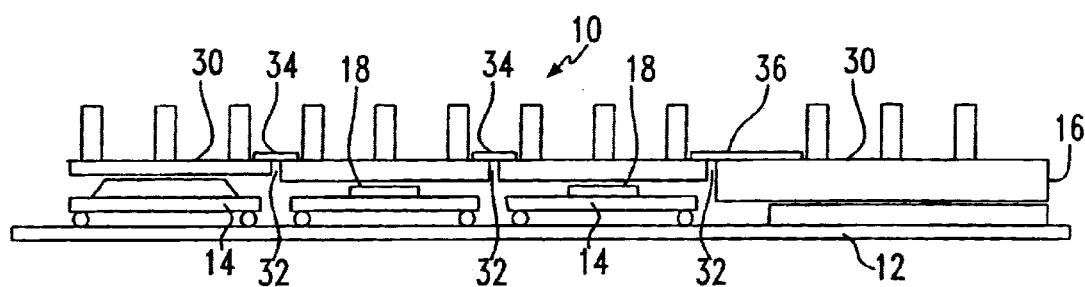
FIG. 2 illustrates a drawing similar to FIG. 1 wherein the common heatsink has been completely severed intermediate the various components and temporarily reattached by a high temperature tape.

Referring to FIG. 2 of the drawings, in a cross-sectional representation there is shown a configuration which is somewhat similar to that of FIG. 1 in which similar components are designated with the same reference numerals. A common heatsink 30 has been completely severed at a number of locations 32 intermediate adjoining modular components 14, 16 or chips 18. Thereafter, the severed locations have been reattached through the intermediary of high temperature tape segments 34, 36 in order to maintain a correct alignment. After all adhesives of the electronic package 10 between the various components have cured, such as between the card, modules and heatsink segments, the tape segments may then be removed so as to form, in essence, discrete heatsink portions of various thicknesses for the respective modules 14, 16 or chips 18. This enables the obtention of a compliance in the x-, y- and z-directions for the heatsink.

Figure 3:
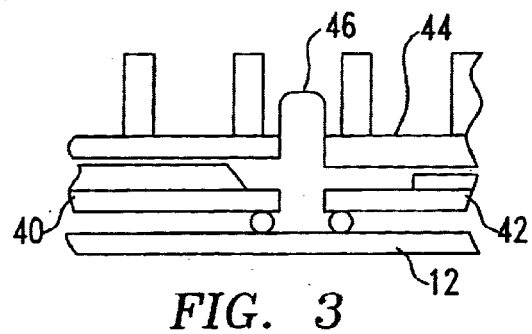
FIG. 3 illustrates a compliant common heatsink for a plurality of semiconductor chips, including U-shaped sections to provide mechanical decoupling.

Referring to the embodiment of FIG. 3 of the drawings showing a partial section of two adjacent electronic package modules 40, 42; a common heatsink 44 possesses thin, preferably flexible U-shaped sections 46 intermediate the modules, which facilitate an even more extensive mechanical decoupling of the package components. Consequently, this construction allows for a more extensive module-to-module height variation between various modules or semiconductor chips, while providing for compliance in x-, y-, and z-directions.

Figure 4:
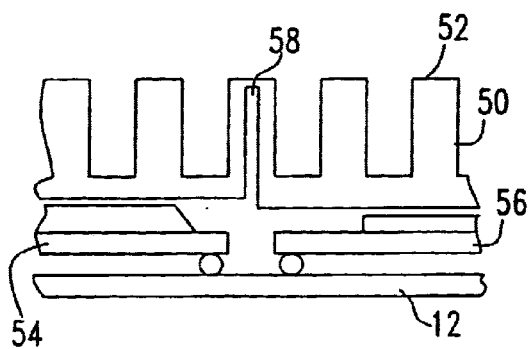
FIG. 4 illustrates a severed heat conductive fin of the common heatsink intermediate plurality of chips to provide for mechanical decoupling.

Referring to FIG. 4, while this is shown to be similar to FIG. 3, this illustrates a common heatsink structure 50 including a plurality of upstanding heat dissipating fins 52, which extends over a plurality of modules 54 or chips 56. Intermediate adjacent modules, the fins 52 are severed by being slitted at locations 58 for mechanical decoupling between the heatsink segments. Each slit may be preferably machined by wire EDM; and affords a compliance in the x-, y-, and z-directions for the package structure.

Figure 5:
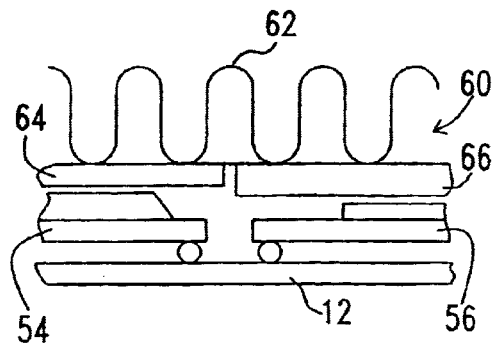
FIG. 5 illustrates a further common heatsink having convoluted configuration to provide for a flexibility in additional module-to-module or chip z-height variations while also enhancing x-y compliance to minimize thermal expansion concerns.

Alternatively, as illustrated in similarly represented FIG. 5 of the drawings, a method of manufacturing the compliant heatsinks 60 may be through the use of convoluted flexible heatsink connecting materials 62 comprised of a thin folded fin stock, which is epoxied or brazed to the rigid heatsink base structures 64, 66. This methodology in construction readily provides for the attainment of additional module-to-module height or z-variations due to the extensive length of the flexible convoluted interconnect portions 62 between the adjacent heatsink bases 64, 66; as well as providing x- and y-directional flexibility to thereby minimize any problems caused by thermal expansion which is encountered during thermal cycling or the operation of the electronic package.

Figure 6A:
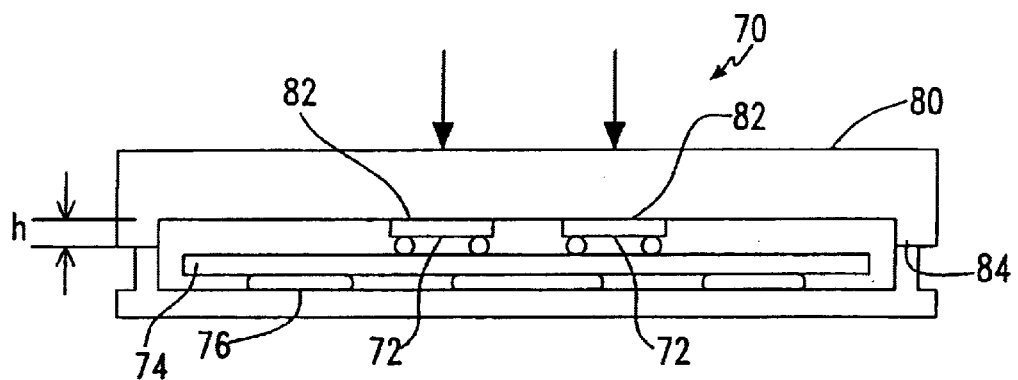
FIGS. 6a and 6b illustrate, respectively, a precision tool for providing plurality of chips with a precision adhesive gap to remove heat, and also to thereby facilitate the positioning of a common heatsink over the plurality of chips in a precise manner.

Reverting to FIG. 6a of the drawings, there is disclosed a cross-sectional view of a precision gap-forming arrangement 70, showing two small chips 72 mounted on a substrate or printed circuit card 74, which are required to possess precision adhesive gaps in order to effectively remove heat through a common heatsink. In order to create a precision gap between the two or more chips 72 and the one common heatsink, a precision tool 80 is utilized to set the height "h" between the top surfaces 82 of the chips 72 and a bottom cover ledge 84 of the tool arrangement which has been machined flat. An adhesive 76 under the printed circuit card 74 is displaced or squeezed until the precision tool contacts the surface of the bottom cover ledge. The adhesive 76 is then cured and a heat transfer adhesive 86 is applied to the surface 82 of the chips 72 after removal of the tool arrangement 70.

Figure 6B:
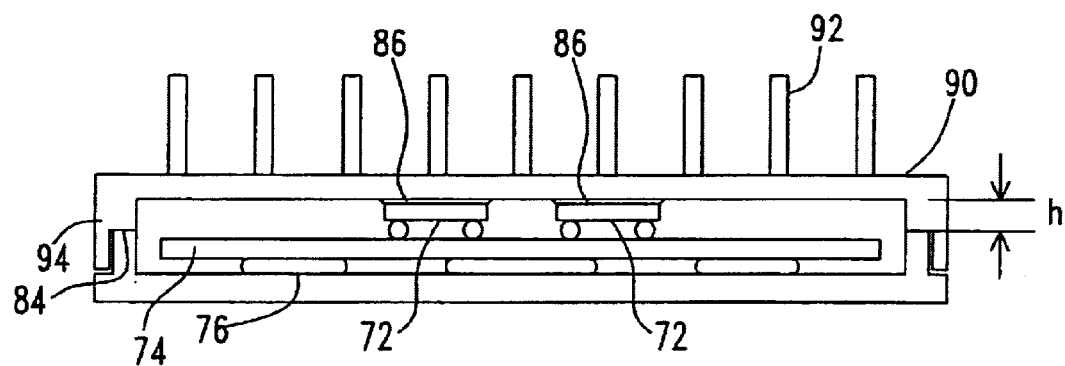

As shown in FIG. 6b of the drawings, subsequently a common heatsink in the form of a plate-like member 90, and having upstanding heat-dissipating fins 92, is then positioned over the chips 72, and lowered until flanges 94 bottom on the surface of the bottom cover ledge 84. The correct adhesive bond line thickness of adhesive 86 is assured between the chips and the heatsink inasmuch as the heatsink has the flanges 94 as a precision step formed therein.

It is also possible to utilize set screws to adjust and lock the card by screws oriented in the z-axis, although as described hereinabove, the embodiment of FIG. 6b of the drawing is the preferred method of construction utilizing the precision tool 70 as described in connection with FIG. 6a of the drawings.

From the foregoing, it becomes readily apparent to one of skilled in the art that the present invention provides for compliant common heatsink structure for a plurality of semiconductor chips and/or modules and lead connected components of an electronic package, in a manner not at all contemplated nor suggested in the prior art. This invention leads to a simple arrangement of providing the necessary heat dissipation from the components of the package while being able to customize the construction of the electronic packages in conformance with manufacturing and customer requirements in a ready and economically expedient manner.

While the invention has been particularly shown and described with respect to preferred embodiments thereof, it will be understood by those skilled in the art that the foregoing and other changes in form and details may be made therein without departing from the spirit and scope of the invention.

What is claimed is:

1. An arrangement for producing precision heat-removing gaps between at least two semiconductor chips mounted on a substrate, and a common heatsink structure extending over said semiconductor chips, comprising:

a bottom cover plate located beneath said substrate and having an upstanding peripheral ledge extending about said substrate;

an upper tool plate having a depending flange being positionable on said semiconductor chips so as to cause said flange to contact an upper surface of said ledge causing an adhesive between said substrate and said bottom cover plate to be configured and cured to correctly position the height of said semiconductor chips on said substrate.

2. An arrangement as claimed in claim 1, wherein said upper tool plate is replaceable by a common heatsink structure which is fastened to said semiconductor chips with precisely dimensioned bond line thickness of an adhesive therebetween upon a flange of said heatsink structure forming a step contacting the upstanding ledge on said bottom cove plate.

3. An arrangement as claimed in claim 2, wherein said heatsink structure precision step is dimensioned in height so as define the bondline thickness and height of the heatsink structure above said bottom plate.

4. A method of producing an electronic package incorporating a plurality of semiconductor chips, said method comprising:

providing a substrate having said semiconductor chips positioned and fixed therein in predetermined spaced relationship; and providing a heatsink for removing heat from said semiconductor chips, said heatsink including a plate-shaped structure commonly extending over said plurality of semiconductor chips in thermally conductive communication therewith, said heatsink structure including compliant regions intermediate said plurality of semiconductor chips so as to facilitate compliance in x-, y- and z-directions in each of said regions to compensate for variations in chip-to-chip height variations, thermal expansion stresses and manufacturing tolerances; said compliant regions in said common heatsink structure being formed by severing said heatsink structure, applying a high-temperature tape to maintain semiconductor chip alignment, while electronic package adhesives are cured, and thereafter removing the tape so as to form heatsink segments over individual said semiconductor chips.

5. A method of producing precision heat-removing gaps between at least two semiconductor chips mounted on a substrate, and a common heatsink structure extending over said semiconductor chips, comprising:

locating a bottom cover plate beneath said substrate and having an upstanding peripheral ledge extending about said substrate;

positioning upper tool plate having a depending flange on said semiconductor chips so as to cause said flange to contact an upper surface of said ledge causing an adhesive between said substrate and said bottom cover plate to be configured and cured to correctly position the height of said semiconductor chips on said substrate.

6. A method as claimed in claim 5, wherein said upper tool plate is replaced by a common heatsink structure which is fastened to said semiconductor chips with the forming of a precisely dimensioned bond line thickness of an adhesive therebetween upon a flange of said heatsink structure forming a step contacting the upstanding ledge on said bottom cover plate.

7. A method as claimed in claim 6, wherein said heatsink structure precision step is dimensioned in height so as define the bondline thickness and height of the heatsink structure from said bottom plate.

* * * * *